United States Patent
Chan et al.

(10) Patent No.: US 7,039,840 B2
(45) Date of Patent: May 2, 2006

(54) METHOD AND APPARATUS FOR HIGH UPDATE RATE INTEGRATED CIRCUIT BOUNDARY SCAN

(75) Inventors: Patrick P. Chan, Rocklin, CA (US); Michael Zheng, Fremont, CA (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 479 days.

(21) Appl. No.: 10/412,718

(22) Filed: Apr. 9, 2003

(65) Prior Publication Data

US 2004/0030973 A1    Feb. 12, 2004

Related U.S. Application Data

(60) Provisional application No. 60/382,422, filed on May 20, 2002.

(51) Int. Cl.
*G01R 31/28* (2006.01)

(52) U.S. Cl. .................................................. 714/724
(58) Field of Classification Search ............... None
See application file for complete search history.

(56) References Cited

U.S. PATENT DOCUMENTS

| | | | |
|---|---|---|---|
| 6,173,428 B1 * | 1/2001 | West | 714/727 |
| 6,785,854 B1 * | 8/2004 | Jaramillo et al. | 714/729 |
| 2001/0037480 A1 * | 11/2001 | Whetsel | 714/727 |

* cited by examiner

*Primary Examiner*—Christine T. Tu
(74) *Attorney, Agent, or Firm*—Akin Gump Strauss Hauer & Feld LLP

(57) ABSTRACT

Boundary scan cells for driving internal logic and sensing internal logic of integrated circuit use external clocks synchronized with internal functional clocks. Synchronized clocks enable synchronous sampling of internal signals and synchronized of injection signals into a functional portion of the integrated circuit.

5 Claims, 4 Drawing Sheets

METHOD AND APPARATUS FOR HIGH UPDATE RATE INTEGRATED CIRCUIT BOUNDARY SCAN

RELATED APPLICATIONS

This present application is related to a provisional application Ser. No. 60/382,422 filed on May 20, 2002, entitled "Method and Apparatus for High Update Rate Boundary Scan Cells", by Chan et al., currently pending, for which the priority date for this application is hereby claimed.

FIELD OF THE INVENTION

This invention relates generally to integrated circuit support for board level testing.

BACKGROUND OF THE INVENTION

Electronic systems are typically built from subassemblies. Each subassembly may comprise several circuit boards that are populated with active components and passive components. Passive components are electronic devices that typically require no operating power. They may, however, dissipate power. Resistors, capacitors, inductor and diodes may all be considered passive devices. Active devices typical use power to drive other parts of an electronic circuit. Transistor based amplifiers and integrated circuits are typically considered to be active elements on a circuit board.

One of the most difficult aspects of testing a fully assembled circuit board is that of identifying if an active component is operating properly. When an active device is mounted on a circuit board, it is difficult to determine if the circuit board is causing a problem or if it is the active device itself that is faulty. For instance, if an active device is attempting to drive a circuit board trace but the logic level on the circuit trace is not correct, it may be due to a short of the circuit trace to another trace or it may be the result of a faulty logic system buried deep in the active integrated circuit.

As integrated circuits became more complex, the need to support board level testability was addressed by an IEEE standard for boundary testing of an integrated circuit (IEEE 1149.1). Boundary level testing, according to modern industry trends, is accomplished by means of a test access port (TAP). The TAP port, which is often referred to as a TAP interface, allows external test apparatus to communicate over a serial interface with each input or output pin on an integrated circuit. Using the TAP interface, any given output pin integral to an integrated circuit may be driven to a particular state irrespective of the state of any functional logic element that would normally be reflected at that output pin. The TAP interface may also be used to retrieve the value perceived at an input pin. Using the serial interface, external test apparatus may read the state present at each input pin.

The TAP interface becomes useful when automated test equipment is used to identify board level faults. The TAP interface is generally used to drive the output pins of one integrated circuit in accordance with a test pattern. The TAP interface can then be used to retrieve the value perceived by an input pin on another integrated circuit. The test apparatus can then compare the perceived pattern from an input pin against the test pattern applied to the output pin to identify faults. In many cases, this technique may be used to identify the source of a fault.

TAP interface based testing has truly advanced the art of board level testing of electronic assemblies and systems. For all of its benefit, TAP interface based testing has been limited to low-rate application of test patterns. Real-time testing is simply not supported unless the system intrinsically operates at a low frequency. The TAP interface only provides for update and telemetry at a 1 MHz serial bit rate, some implementations operate at much higher frequencies.

The TAP interface is generally used to communicate with a circuit element known as a boundary scan cell. There are two basic types of boundary scan cells that have been used in the fabrication of integrated circuits; a transmit boundary scan cell and a receive boundary scan cell. The transmit boundary scan cell is typically used when testing requires that a particular pin of an integrated circuit mounted on a printed circuit board be driven to a particular state. The receive boundary scan cell is used to enable monitoring of the logic level perceived by an input pin of the integrated circuit.

Because the TAP interface operates at a relatively low frequency, boundary scan cells have been implemented to respond to a serial shift clock that is normally generated by a TAP controller, also integral to the integrated circuit. This technique for clocking data in to and out of a boundary scan cell worked well so long as the boundary scan cell was disposed immediately at the driver of an integrated circuit output pin or at the receiver of an input pin. Hence, the boundary scan cell could be treated as an adjunct appendage of the functional, application specific portions of an integrated circuit.

In many cases, the output pins of an integrated circuit must be driven at faster rates and input pins must also be equivalently monitored. In these cases, the boundary scan cells can no longer be disposed immediately at the output or input pin of an integrated circuit. In these applications, the boundary scan cells must be designed with additional cognizance of the application specific circuitry at the heart of the integrated circuit. In essence, the boundary scan cells may need to be integral with the primary functional circuitry of the integrated circuit.

SUMMARY

One specific case where boundary scan cells may need to be integrated into the primary functional circuitry of an integrated circuit is that of a serial output. In prior art methods, the serial output of an integrated circuit was manipulated through the TAP interface in order to mimic a serial bit stream. This technique could rarely be used to produce a real-time serial bit stream as might be necessary to test the impedance of circuit board traces intended to carry a high-speed serial interface.

In order to support real-time outputs of this nature, boundary scan cells may be positioned to drive the input of a data serializer. The data serializer may be preloaded with a data pattern through the TAP port and then clocked to produce a real-time serial output. The real-time serial output could then be used to drive the output pin of the integrated circuit directly. In fact, positioning of boundary scan cells to support serial input and output is the subject of the Applicant's co-filed application entitled "Method And Apparatus For Boundary Scan Of Serial Interfaces" filed under Applicant's Ser. No. 60/382,299. It should be noted that the scope of the present invention is not to be limited to application in serial interfaces. The method and apparatus of the present invention may be applied to any functional logic bit in an integrated circuit so as to enable test access port drive and sensing capabilities of any signal in a target integrated circuit.

The present invention addresses the need for integration of boundary scan cells into the functional aspects of an integrated circuit. This is often necessary where the functional circuitry needs to continue to operate in real-time. This means that test-mode sensing or injection of logic signals into the circuit can not interfere with normal operation. One example method for driving a functional logic signal within an integrated circuit relies on receiving an input logic signal from either a proceeding boundary scan cell or a test access port controller. The test access port controller typically generates a shift-in signal that may be used to control generation of the functional logic signal. For instance, in one example method of the present invention, the state of the input logic signal may be stored if the shift-in signal is active. A reference clock may be used to store a digital value, i.e. the internal functional logic signal that is to be injected into the integrated circuit.

The method of the present invention further defines that the value stored according to the reference clock should be either an internal logic bit generated by some functional aspect of the integrated circuit or the input logic bit stored according to the shift-in signal. The input logic bit stored according to the shift-in signal is typically stored according to the reference clock if the boundary scan cell is in a test mode. Depending on whether the integrated circuit is in a test mode, the functional logic signal generated by the functional circuit portion of the integrated circuit can be supplanted with the serial input signal stored according to the reference clock.

According to one illustrative variation of the present method, the logic value received from either a preceding boundary scan cell or the test access controller may be accomplished relative to a test access port clock that may be generated by the test access port controller. When the shift-in signal is inactive, the most recently stored value may be retained.

In order to ensure that the boundary scan cell is properly integrated into a functional circuit element within an integrated circuit, one method for driving an internal signal according to a reference clock may first require that the reference clock be synchronized with an internal functional logic clock. This illustrative method provides that an external clock may be phase synchronized with the integrated circuit's functional logic clock in order to create the reference clock. The reference clock may then be used to store logic values that may be then driven to other functional elements within the integrated circuit or to a succeeding boundary scan cell or to a test access port controller.

The present invention further comprises a method for monitoring a functional signal within an integrated circuit by first receiving a shift signal and a reference clock. A test access port clock that is synchronized with the reference clock may also be required in order to sample the logic state of the functional signal generated internally in the integrated circuit. Based on the state of a shift signal, this example method provides for storing as a serial output bit either the logic state of the internal functional signal or the most recently stored state of that signal. One variation of this method provides that an external clock should be phase synchronized with a functional logic clock that may be used to control the synchronous operation of a functional circuit element within the integrated circuit. The stored logic value may then be directed to a succeeding boundary scan cell or to a test access port controller.

The present invention also comprises a boundary scan cell comprising two storage elements and three multiplexers. The output of the first multiplexer is sampled by the first stored element according to a test access port clock. The first multiplexer, according to a shift signal, conveys to the first storage element either the value stored by the first storage element or a serial input that may be received from a preceding boundary scan cell or a test access port controller. The output of the first stored element may be directed to a succeeding boundary scan cell or to a test access port controller. The output of the first storage element is also directed to the second multiplexer, which according to an update signal, selects either the output of the second storage element or the first storage element. The output of the second multiplexer is directed to the third multiplexer. A mode signal is used by the third multiplexer to select between the output of the second multiplexer and a functional logic signal that may be generated by a functional circuit within the integrated circuit. The second storage element stores the logic value provided by the third multiplexer. Typically, the second storage element captures the output of the third multiplexer according to a reference clock. In one alternative embodiment of the present invention, the boundary scan cell may further comprise a phase synchronization circuit that synchronizes an external clock with an internal functional logic clock in order to generate the reference clock that is used to sample the output of the third multiplexer.

The invention also comprises a boundary scan cell that may be used to sample an internal logic signal. In one example embodiment of the present invention, a boundary scan cell may comprise two multiplexers and a storage element. Typically, the storage element samples its input relative to a reference clock. One alternative embodiment of the present invention further comprises a phase synchronization circuit that is capable of synchronizing a functional logic clock with an external clock that synchronizes the reference clock with the functional clock. This results in the reference clock. The output of the storage element may be directed to a succeeding boundary scan cell or to a test access port. The first multiplexer typically receives two inputs; a serial input and a functional logic signal. The serial input is typically received either from a preceding boundary scan cell or from a test access port controller. The functional logic signal is that signal that is to be sampled by the boundary scan cell. The functional logic signal is selected by the first multiplexer if a shift signal is inactive. A synchronized test access port clock controls the second multiplexer in order to select either the output of the storage element or the output of the first multiplexer. The output of the second multiplexer is then sampled by the storage element.

BRIEF DESCRIPTION OF THE DRAWINGS

These and other features and advantages of the invention will be more readily apparent upon reading the following description of a preferred exemplified embodiment of the invention and upon reference to the accompanying drawings wherein.

DETAILED DESCRIPTION OF THE INVENTION

Figure 1:
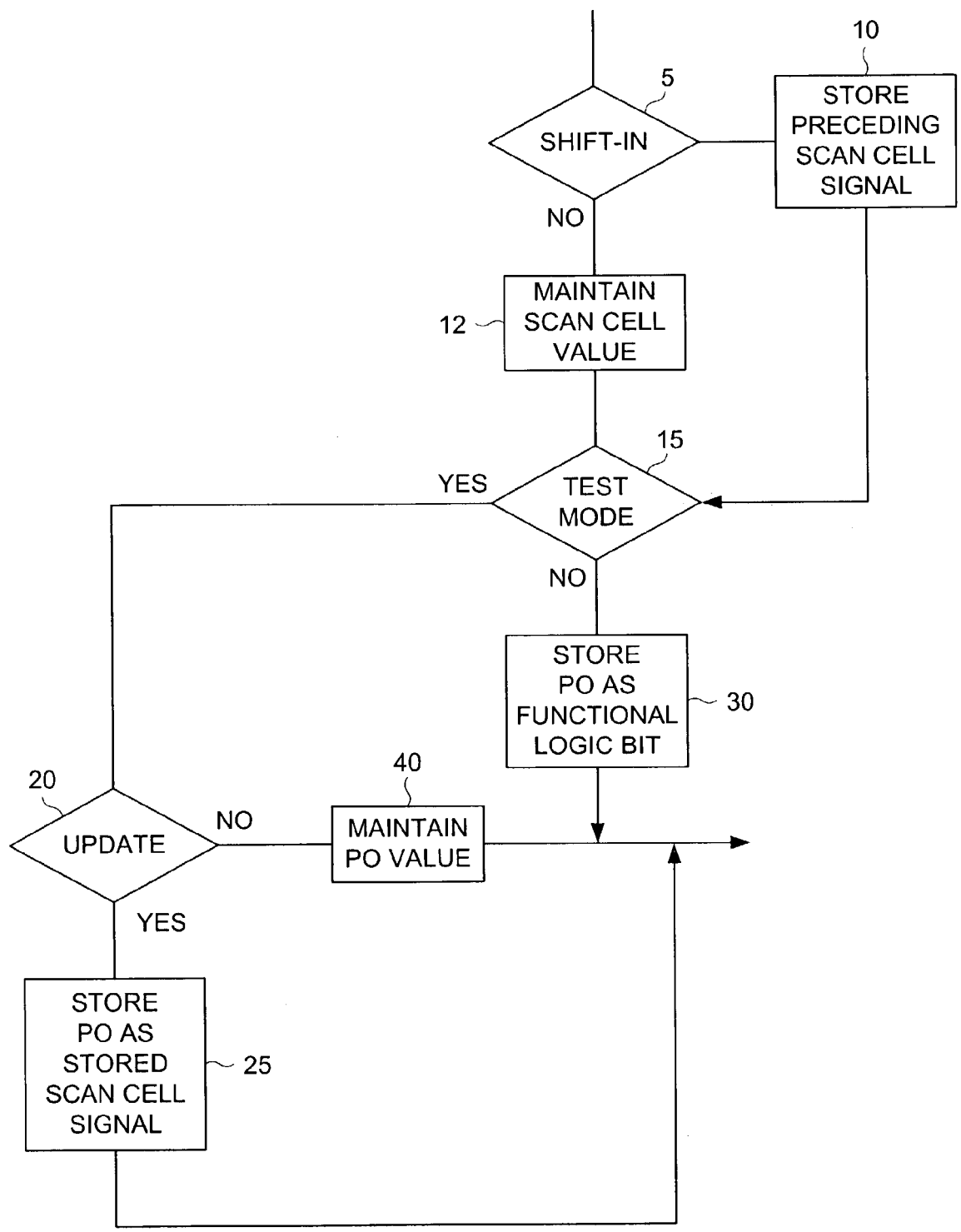
FIG. 1 is a flow diagram that depicts one example method for driving a functional bit within an integrated circuit according to the present invention.

FIG. 1 is a flow diagram that depicts one example method for driving a functional bit within an integrated circuit according to the present invention. According to one illustrative method of the present invention, a functional logic signal, which is referred to as Po, may be generated coincident with a reference clock. Typically, the reference clock is used to store a logic value that would become the functional drive signal of the functional logic bit (Pi) once the logic value is stored coincident with the reference clock. According to one method, driving the functional logic signal Po comprises a first step of receiving an input logic bit (Si) from a proceeding boundary scan cell or from a test access port controller. The test access port controller will typically generate a shift-in signal. The method of the present invention provides that the shift-in signal may be used to dictate if (step 5) the state of the input logic bit Si from the proceeding boundary scan cell or from the test access port should be stored (step 10). Once the input logic bit is stored, it may be used as the basis of the functional logic signal Po that is to be driven within the integrated circuit. The stored logic bit may also be conveyed to a succeeding boundary scan cell or to a test access port controller.

According to one variation of the example method taught here, storing the state of the input logic bit Si may be accomplished by storing either the input logic bit Si or the most recently stored input logic bit Si based on the state of the shift-in signal. In the event the shift-in signal is active, the input logic bit Si is stored (step 10) whereas the most recently stored input logic bit is stored (i.e. retained in storage) if the shift-in signal is inactive (step 12).

The method of the present invention further provides for receiving a reference clock, an update signal and a test-mode signal. The method of the present invention also provides that the functional logic signal Po should be driven either by the stored input logic bit or from a functional logic bit Pi that may be generated by a functional logic element comprising the integrated circuit. The method of the present invention provides that the functional logic signal Po be generated by storing the state of the functional logic bit Pi (step 30) coincident with the reference clock if the test-mode signal is inactive (step 15). The functional logic signal Po may also be generated by storing the state of the stored input logic bit Si (step 25) if the test-mode signal and the update signal are both active (steps 15 and 20). The stored state of Po may be maintained by selecting for storage the most recently stored logic value of the functional logic bit Po (step 40) if the test-mode signal is active and the update signal is inactive (steps 15 and 20).

The method of the present invention dictates that the functional logic signal Po should be updated coincident with a reference clock. According to one alternative method, the reference clock may be generated by receiving an external clock, a functional clock that is used to control the synchronous behavior of the functional circuit comprising the integrated circuit and then phase synchronizing the external clock to the functional clock. In many cases, this phase synchronization may be accomplished by a phase-lock-loop.

Figure 2:
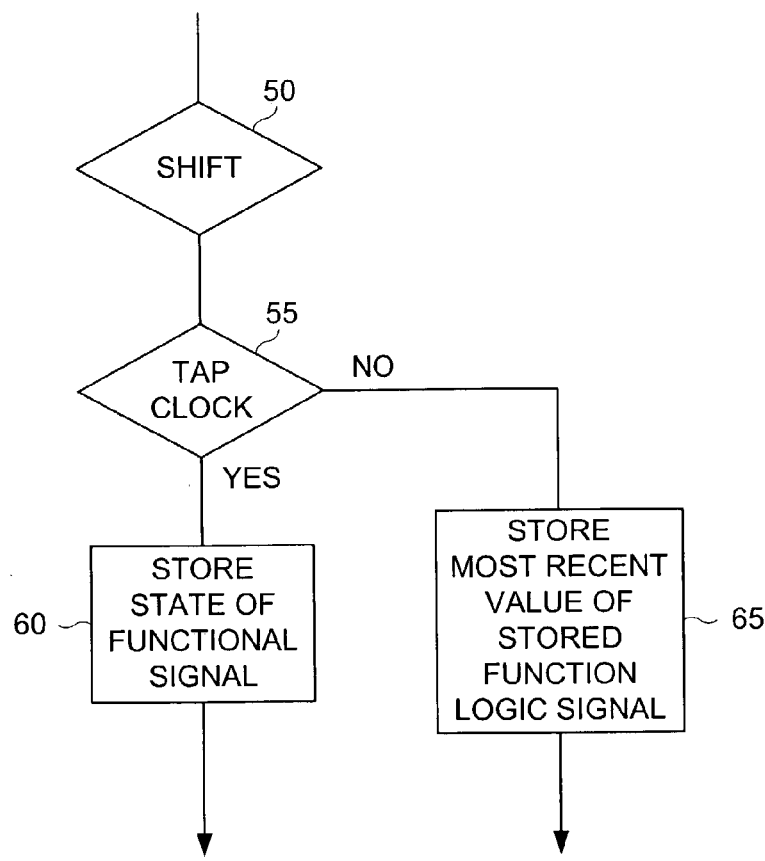
FIG. 2 is a flow diagram that depicts one example method for sensing the state on a logic state of a signal internal to an integrated circuit according to the present invention.

FIG. 2 is a flow diagram that depicts one example method for sensing the state of a logic state of a signal internal to an integrated circuit according to the present invention. The present invention also provides for a method by which the state of a logic signal (Pi) within an integrated circuit may be ascertained through a test access port. According to one illustrative method of the present invention, the state of a functional signal Pi may be monitored by receiving a shift signal, receiving a reference clock, receiving a synchronized test access port clock and storing as a serial output bit So the logic state of the functional signal Pi.

Typically, storage of the state of the functional signal Pi (step 60) is accomplished relative to the reference clock if the shift signal is not active (step 50) and the synchronized test access port clock is active (step 55). The method of the present invention provides that the shift signal be generated by a test access port controller. Generally, the test access port controller will generate a clock signal. This clock signal may need to be synchronized with a functional clock that may be used to drive the synchronous operation of a functional circuit element comprising the integrated circuit. The stored serial output bit So may then be conveyed to a succeeding boundary scan cell or to a test access port controller. In the event that the synchronized TAP clock is not active (step 55), the previously stored value of the stored serial output bit So is retained (step 65).

Figure 3:
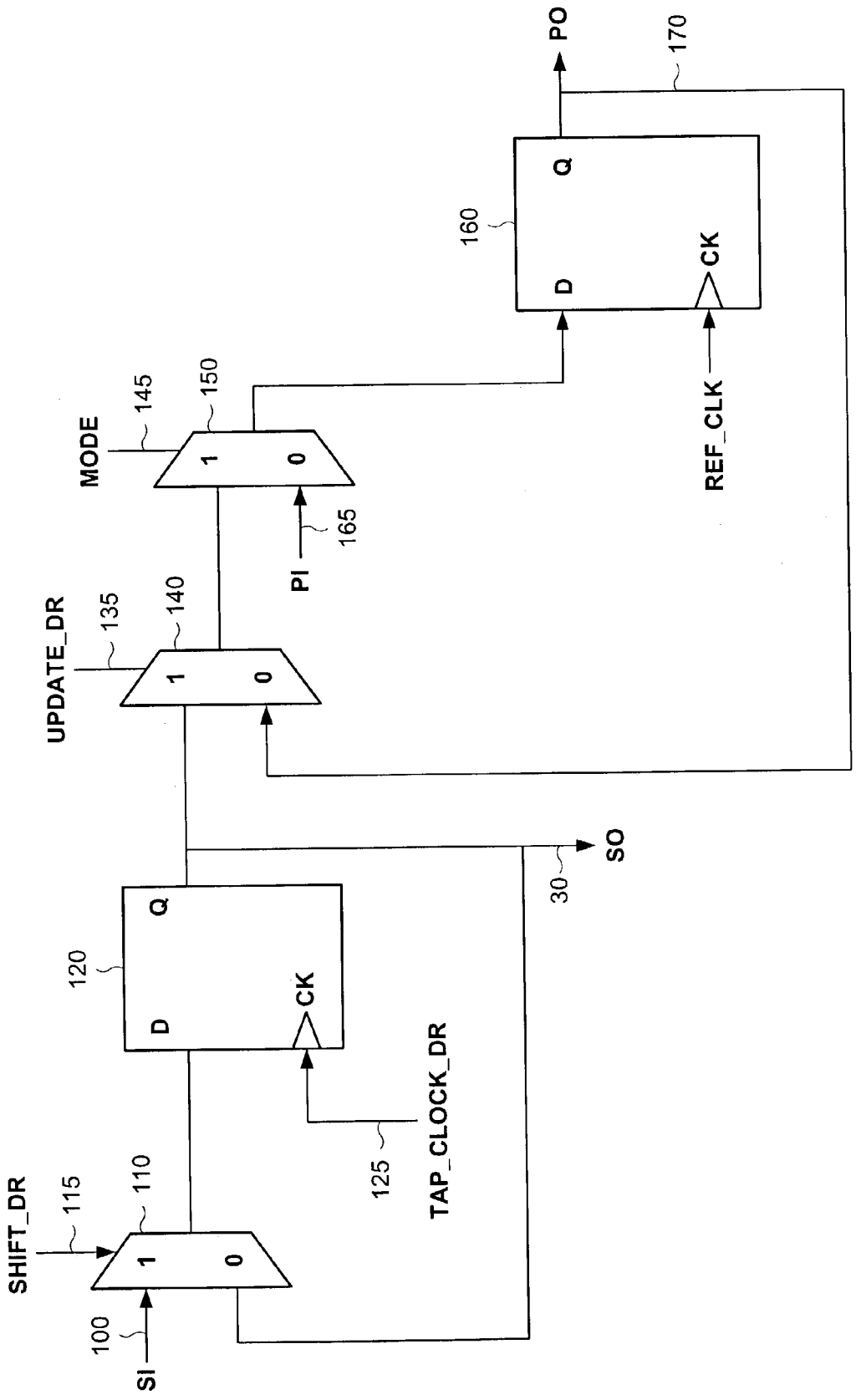
FIG. 3 is a block diagram of a boundary scan cell that may be used to drive a functional logic signal within an integrated circuit according to the teachings of the present invention.

FIG. 3 is a block diagram of a boundary scan cell that may be used to drive a functional logic signal within an integrated circuit according to the teachings of the present invention. According to the present invention, the boundary scan cell may be controlled by a shift signal 115. A first storage element 120 comprising the scan cell may be caused to store the value present at its input coincident with a test access port clock 125. The first storage element may be a flip-flop. The first storage element 120 may be driven by the output of a first multiplexer 110 that also comprises the boundary scan cell. The shift signal 115, when active, causes the first multiplexer 110 to propagate a serial input Si to the first storage element 120. When the shift signal 115 is inactive, the first multiplexer 110 will direct the output of the first storage element 120 back around the input of the first storage element 120. Effectively, this causes the first storage element to retain its present value upon the occurrence of the test access port clock signal 125 when the shift signal 115 is inactive.

The serial input stored by the first storage element 120 may be considered a serial output So 130 that may be directed to a subsequent boundary scan cell or to the test access port controller. A functional logic signal Po 170 may be generated relative to a reference clock. The reference clock may itself be generated either internally on the integrated circuit and may be the same clock used to control the sequential operation of any functional circuit comprising the integrated circuit itself. The reference clock may also be generated from an external clock that may be phase synchronized with the functional clock that controls the sequential operation of the functional circuit comprising the integrated circuit. The integrated circuit may further comprise a phase-lock-loop that may perform this synchronization.

According to one illustrative embodiment, the boundary scan cell may further comprise a second storage element 160, which may be a flip-flop. The functional logic signal Po 170 comprises the output of the second storage element 160 and this second storage element 160 is enabled (i.e. clocked) by the reference clock. The input to the second storage element 160 may be selected to be a functional logic bit Pi 165 that may be generated by a functional circuit element comprising the integrated circuit. This selection is accomplished by a second multiplexer 150 that further comprises the boundary scan cell according to the present invention and is controlled by a test-mode signal 145. When the test-mode signal is inactive, the functional logic bit Pi 165 is directed to the input of the second storage element 160. Otherwise, a third multiplexer 140 that also comprises the boundary scan cell may cause the stored input logic bit So 130 to be directed to the input of the second storage element 160 when an update signal 135 controlling the third multiplexer 140 is active. When the update signal 135 is inactive, the output of the second storage element 160, i.e. Po 170, is directed to its input. This causes the second storage element 160 to retain its present value upon the occurrence of the reference clock when the update signal 135 and the test-mode signal 145 are both active. The functional logic signal Po 170 may then be directed to the functional circuit element comprising the integrated circuit.

Figure 4:
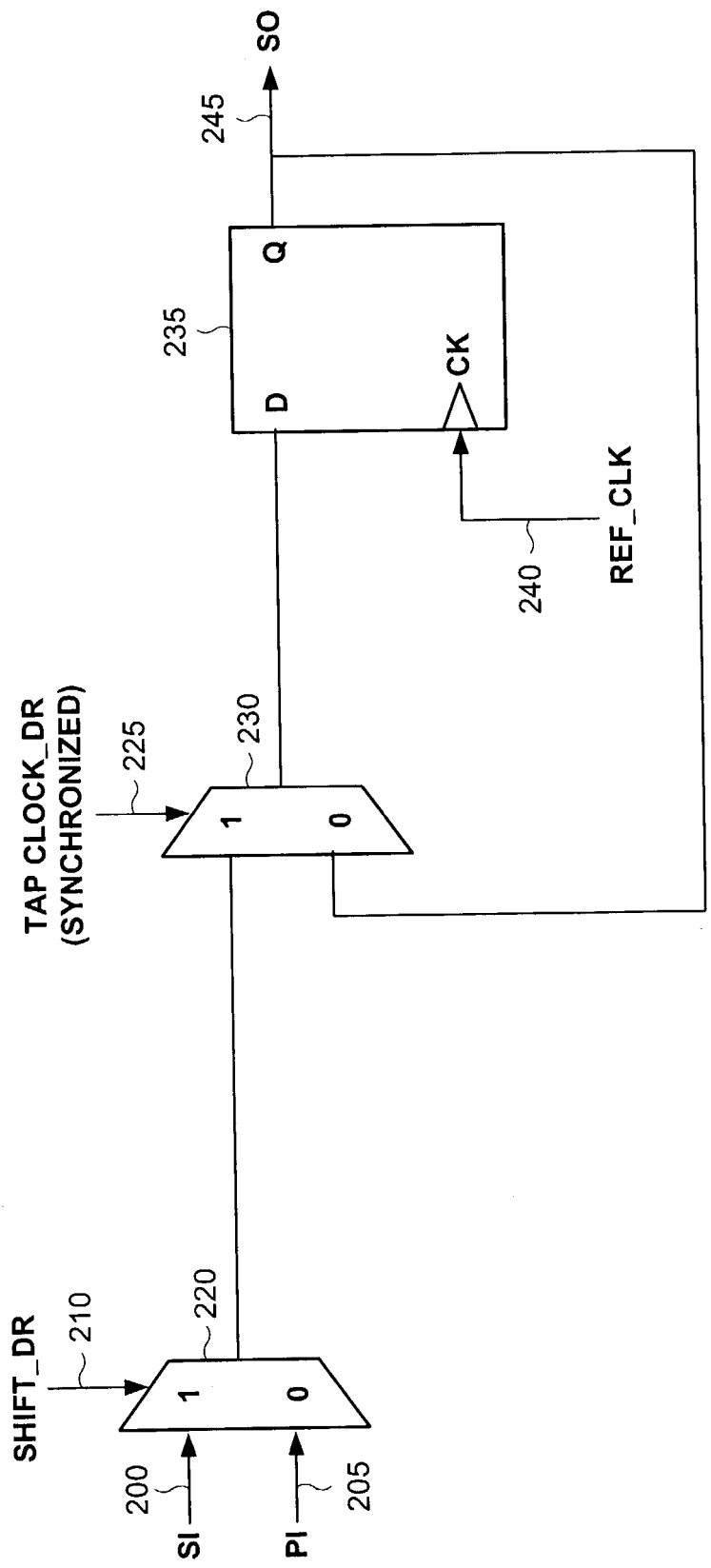
FIG. 4 is a block diagram of a boundary scan cell that may be used to monitor the state of an internal functional logic signal through a test access port.

FIG. 4 is a block diagram of a boundary scan cell that may be used to monitor the state of an internal functional logic signal through a test access port. According to one illustrative embodiment, a receiver boundary scan cell may comprise a first multiplexer 220 that may be controlled by a shift signal 210. The boundary scan cell further comprises a second multiplexer 230 that may be controlled by a synchronized test access port clock 225. The boundary scan cell also comprises a first storage element 235 that may be enabled by a reference clock 240.

In operation, the output of the first storage element 235 comprises a serial output So 245 that may be conveyed either to a succeeding boundary scan cell or to a test access port. When the synchronized test access port clock 225 is inactive, the output of the first storage element 245 is fed back to the input. This causes the storage element 235 to retain its present value upon the occurrence of the reference clock 240. When the synchronized test access port clock 225 is active, the second multiplexer 230 selects for storage in the storage element either a serial input Si 200 or a functional logic bit Pi 205. When the shift signal 210 is active, the serial input Si 200 may be directed to the storage element 235 and stored as the serial output So 245 when the synchronized test access port clock is active. If the shift signal 210 is inactive, the first multiplexer directs the functional logic bit Pi 205 to the storage element 235. The functional logic bit Pi 205 may be any logic signal generated by a functional circuit element comprising the integrated circuit.

Alternative Embodiments

While this invention has been described in terms of several preferred embodiments, it is contemplated that alternatives, modifications, permutations, and equivalents thereof will become apparent to those skilled in the art upon a reading of the specification and study of the drawings. It is therefore intended that the true spirit and scope of the present invention include all such alternatives, modifications, permutations, and equivalents.

We claim:

1. A method for driving a functional logic signal within an integrated circuit by way of a test access port comprising the steps of:
   receiving an input logic bit from one of either a preceding boundary scan cell or a test access port controller;
   receiving a shift-in signal;
   storing the state of the input logic bit coincident with a test access port clock if the shift-in signal is active;
   receiving a reference clock;
   receiving an update signal;
   receiving a test-mode signal;
   receiving a functional logic bit;
   storing as the functional drive signal the state of the functional logic bit coincident with the reference clock if the test-mode signal is inactive; and
   storing as the functional drive signal the state of the stored input logic bit coincident with the reference clock if the test-mode signal and the update signal
   are both active.

2. The method of claim 1 wherein the step of storing the state of the input logic bit comprises the steps of:
   selecting for storage coincident with a test access port clock the input logic bit if the shift-in signal is active; and
   selecting for storage coincident with a test access port clock the most recently stored value of the input logic bit if the shift-in signal is inactive.

3. The method of claim 1 wherein the step of receiving a reference clock comprises the steps of:
   receiving a clock signal from an external source;
   receiving a functional logic clock that is used to control the synchronous operation of a functional circuit element comprising the integrated circuit; and
   phase synchronizing the external clock to the functional logic clock to produce a reference clock.

4. The method of claim 1 wherein the step of storing as the functional drive signal the state of the stored input logic bit comprises the steps of:
   selecting for storage as the functional drive signal coincident with the reference clock the stored input logic bit if the test-mode signal and the update signal are both active; and;
   selecting for storage as the functional drive signal coincident with a reference clock the most recently stored logic value of the functional drive signal if the test-mode signal is active and the update signal is inactive.

5. The method of claim 1 further comprising the step of conveying the stored logic bit to either a succeeding boundary scan cell or to a test access port controller.

* * * * *